(12) United States Patent
Fang

(10) Patent No.: US 8,088,992 B2
(45) Date of Patent: *Jan. 3, 2012

(54) SOLAR CELL RECEIVER HAVING AN INSULATED BYPASS DIODE

(75) Inventor: Lu Fang, Albuquerque, NM (US)

(73) Assignee: Encore Solar Power, Inc., Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/703,561

(22) Filed: Feb. 10, 2010

(65) Prior Publication Data

US 2010/0139752 A1  Jun. 10, 2010

Related U.S. Application Data

(63) Continuation of application No. 11/849,033, filed on Aug. 31, 2007, now Pat. No. 7,671,270, which is a continuation of application No. 11/830,576, filed on Jul. 30, 2007.

(51) Int. Cl.
    *H01L 31/042* (2006.01)
(52) U.S. Cl. .................. 136/255; 136/256
(58) Field of Classification Search .......... 136/243–265
    See application file for complete search history.

(56) References Cited

U.S. PATENT DOCUMENTS

| | | | |
|---|---|---|---|
| 4,188,238 A | 2/1980 | Boling | |
| 4,460,232 A * | 7/1984 | Sotolongo | 439/535 |
| 5,951,785 A * | 9/1999 | Uchihashi et al. | 136/251 |
| 6,020,555 A | 2/2000 | Garboushian et al. | |
| 6,331,670 B2 | 12/2001 | Takehara et al. | |
| 6,344,612 B1 * | 2/2002 | Kuwahara et al. | 174/50 |
| 7,671,270 B2 * | 3/2010 | Fang | 136/255 |
| 2004/0045598 A1 * | 3/2004 | Narayanan et al. | 136/255 |
| 2009/0032092 A1 * | 2/2009 | Fang | 136/255 |

FOREIGN PATENT DOCUMENTS

| | | |
|---|---|---|
| JP | 2001-168368 A | 6/2001 |
| JP | 2004-342986 A | 12/2004 |

OTHER PUBLICATIONS

Geisz, J.F., et al., "Toward a Monolithic Lattice-Matched III-V on Silicon Tandem Solar Cell." 19th European PV Solar Energy Conference and Exhibit, Paris, France, Jun. 7-11, 2004.
Definition of "connector," http://dictionary.reference.com/browse/connector, date unknown.
Office action in U.S. Appl. No. 11/830,576 (dated Jun. 28, 2011).

* cited by examiner

*Primary Examiner* — Jessica L Ward
*Assistant Examiner* — Kevin E Yoon

(57) ABSTRACT

A solar cell receiver comprising a solar cell having one or more III-V compound semiconductor layers, a diode coupled in parallel with the solar cell and operable to be forward-biased in instances when the solar cell is not generating above a threshold voltage, a coating substantially encapsulating the diode, an undercoating that substantially eliminates any air gap between the anode and cathode of the diode, and a connector adapted to couple to other solar cell receivers.

20 Claims, 4 Drawing Sheets

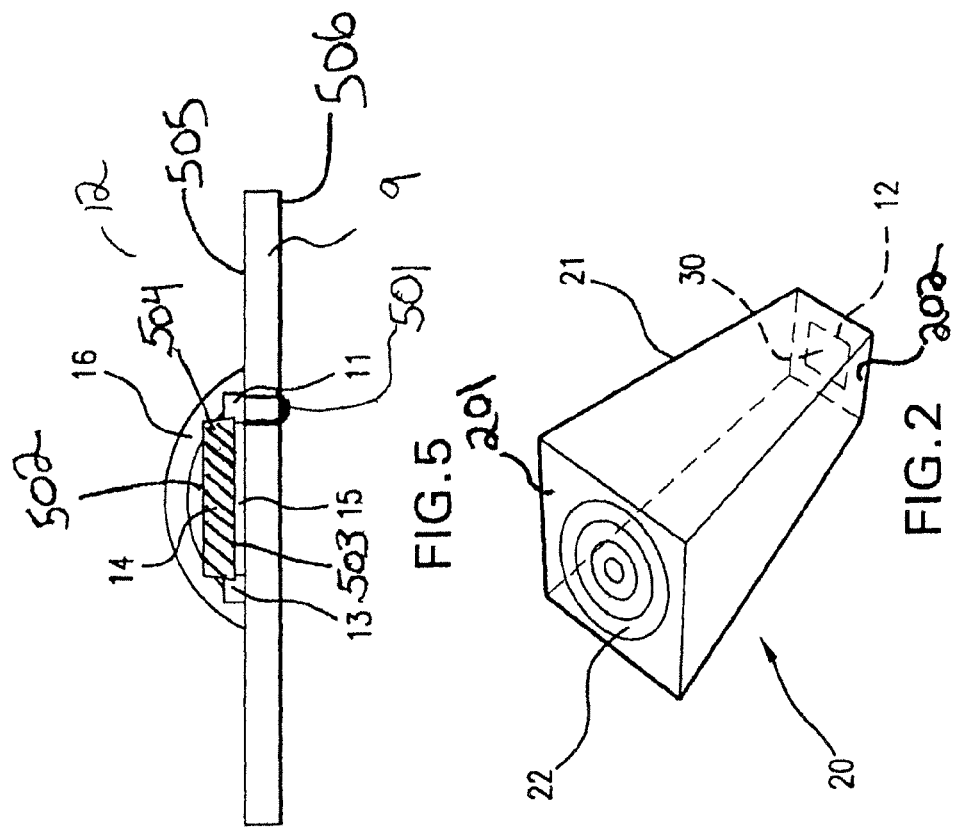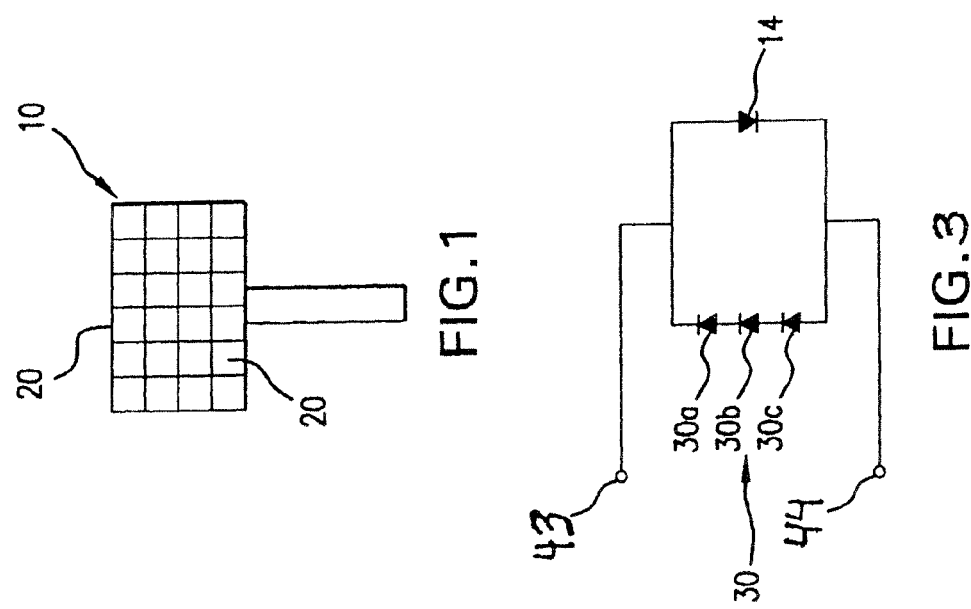

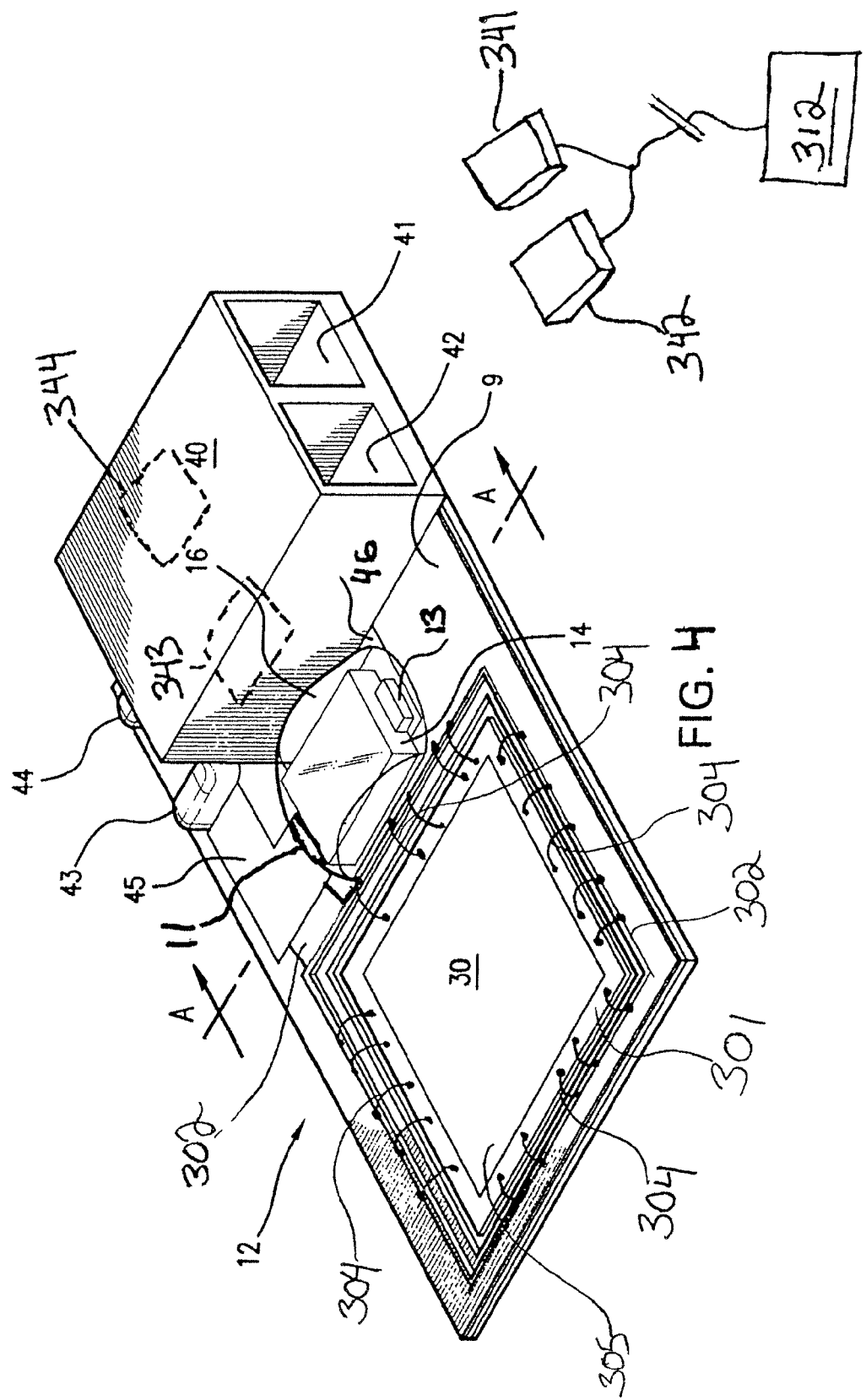

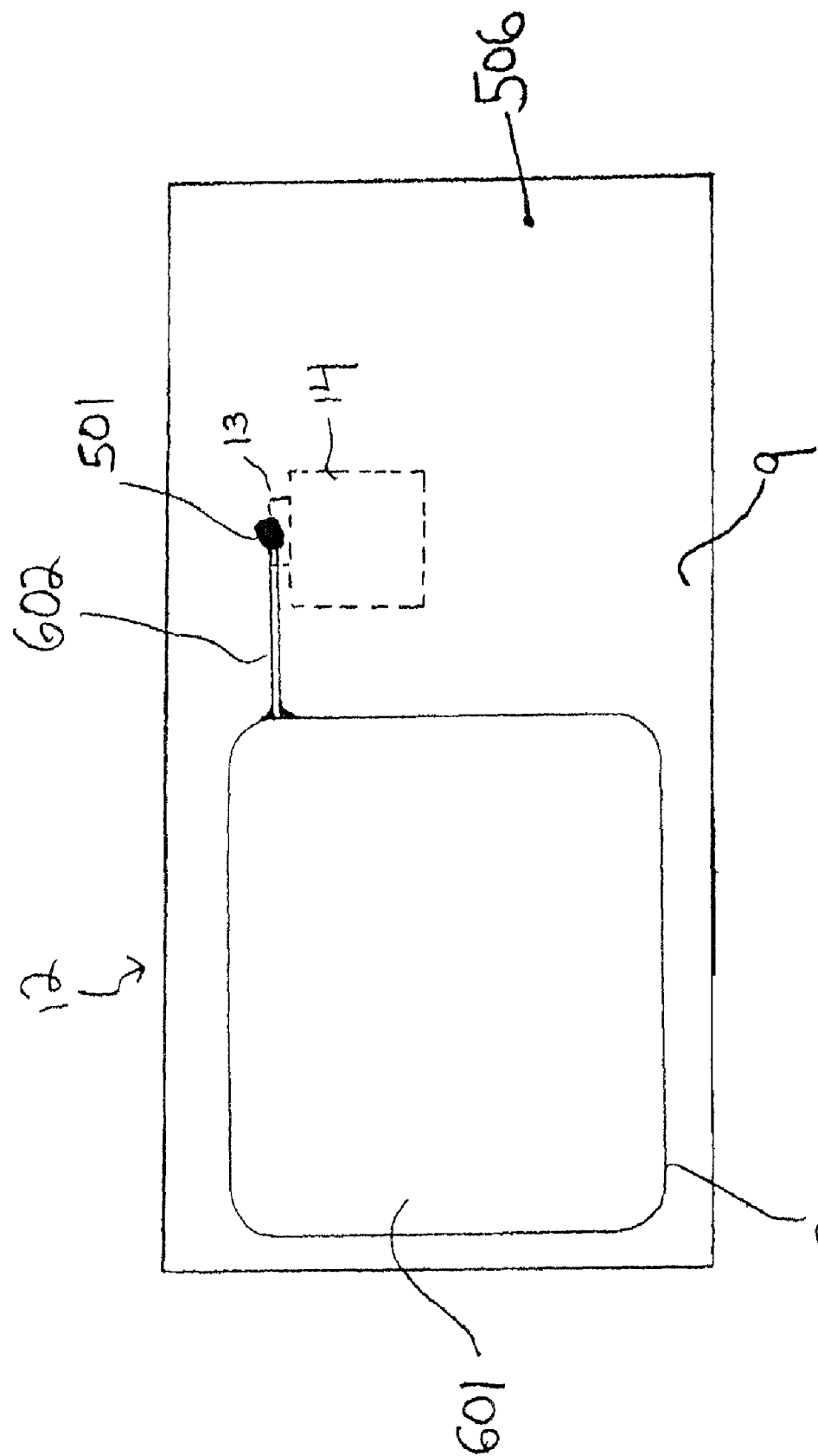

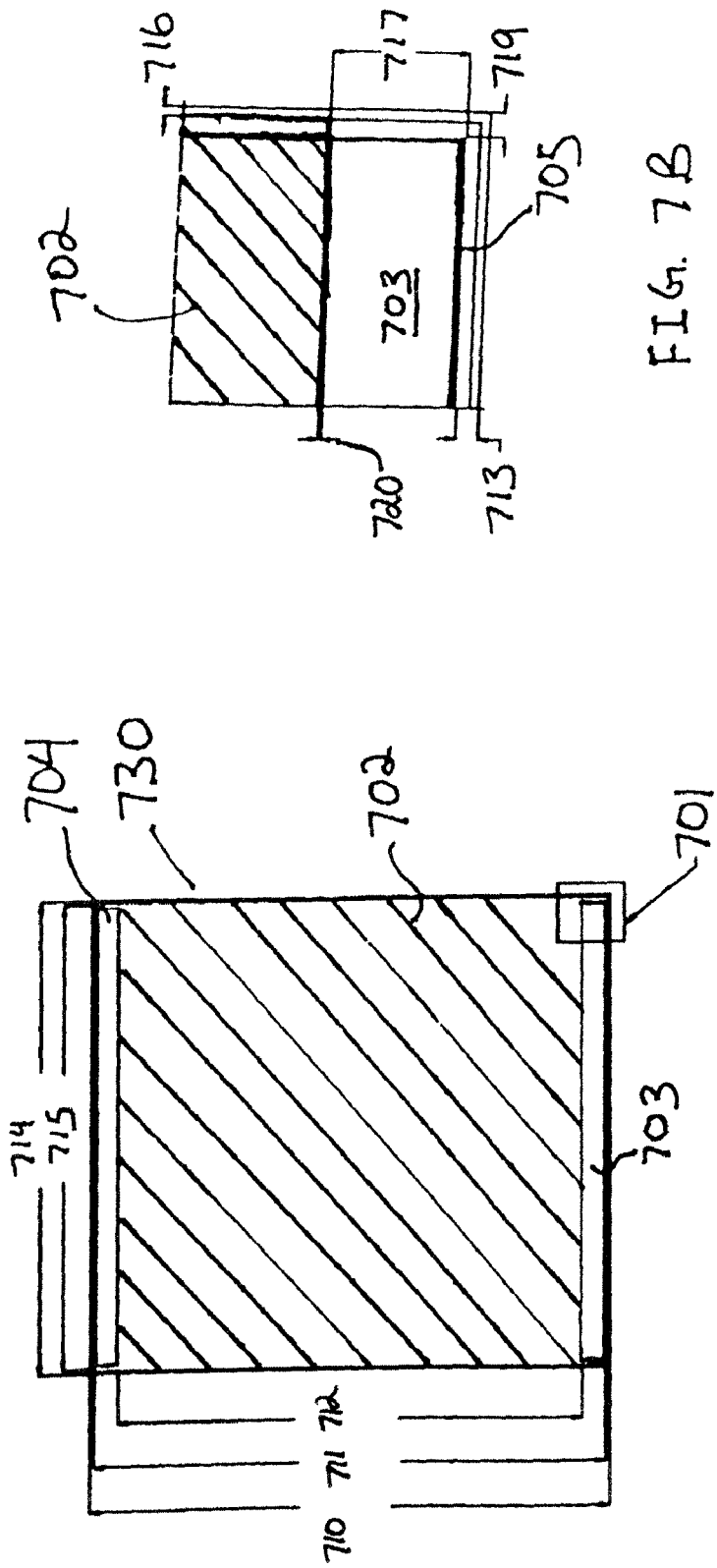

SOLAR CELL RECEIVER HAVING AN INSULATED BYPASS DIODE

CROSS REFERENCE TO RELATED APPLICATIONS

This application is a continuation of co-pending U.S. application Ser. No. 11/849,033, filed 31 Aug. 2007, which itself is a continuation of U.S. application Ser. No. 11/830,576, filed on 30 Jul. 2007; each of which is herein incorporated by reference in its entirety.

The disclosure of this application is also related to U.S. application Ser. No. 11/830,636, filed on 30 Jul. 2007, now U.S. Pat. No. 7,381,886.

TECHNICAL FIELD

This disclosure relates to a solar cell receiver having an insulated bypass diode.

BACKGROUND

Solar cells are used to convert radiant energy into electricity, and can be operated at a relatively low cost as the energy generated is received from the sun.

Typically, a plurality of solar cells are disposed in an array or panel, and a solar energy system typically includes a plurality of such panels. The solar cells in each panel are usually connected in series, and the panels in a given system are also connected in series, with each panel having numerous solar cells. The solar cells in each panel could, alternatively, be arranged in parallel.

Historically, solar power (both in space and terrestrially) has been predominantly provided by silicon solar cells. In the past several years, however, high-volume manufacturing of high-efficiency multi-junction solar cells has enabled the use of this alternative technology for power generation. Compared to Si, multi-junction cells are generally more radiation resistant and have greater energy conversion efficiencies, but they are also heavier (higher density and thickness) and tend to cost more. Some current multi-junction cells have energy efficiencies that exceed 27%, whereas silicon technologies generally reach only about 17% efficiency. When the need for very high power or smaller solar arrays are paramount in a spacecraft or other solar energy system, multi-junction cells are often used instead of, or in hybrid combinations with, Si-based cells to reduce the array size.

Generally speaking, the multi-junction cells are of n-on-p polarity and are composed of InGaP/(In)GaAs III-V compounds. III-V compound semiconductor multi-junction solar cell layers can be grown via metal-organic chemical vapor deposition (MOCVD) on Ge substrates. The use of the Ge substrate has two advantages over III-V compound semiconductor substrates such as GaAs: lower cost and higher structural breakage strength. The solar cell structures can be grown on 100-mm diameter (4 inch) Ge substrates with an average mass density of about 86 mg/cm$^2$. In some processes, the epitaxial layer uniformity across a platter that holds 12 or 13 Ge substrates during the MOCVD growth process is better than 99.5%. Each wafer typically yields two large-area solar cells. The cell areas that are processed for production typically range from 26.6 to 32.4 cm$^2$. The epi-wafers can be processed into complete devices through automated robotic photolithography, metallization, chemical cleaning and etching, antireflection (AR) coating, dicing, and testing processes. The n-& p-contact metallization is typically comprised of predominately Ag with a thin Au cap layer to protect the Ag from oxidation. The AR coating is a dual-layer TiO$_x$/Al$_2$O$_3$ dielectric stack, whose spectral reflectivity characteristics are designed to minimize reflection at the coverglass-interconnect-cell (CIC) or solar cell assembly (SCA) level, as well as, maximizing the end-of-life (EOL) performance of the cells.

In some multi-junction cells, the middle cell is an InGaAs cell as opposed to a GaAs cell. The indium concentration may be in the range of about 1.5% for the InGaAs middle cell. In some implementations, such an arrangement exhibits increased efficiency. The InGaAs layers are substantially perfectly lattice-matched to the Ge substrate.

Regardless of the type of cell used, a known problem with solar energy systems is that individual solar cells can become damaged or shadowed by an obstruction. For example, damage can occur as a result of exposure of a solar cell to harsh environmental conditions. The current-carrying capacity of a panel having one or more damaged or shadowed solar cells is reduced, and the output from other panels in series with that panel reverse biases the damaged or shadowed cells. The voltage across the damaged or shadowed cells thus increases in a reverse polarity until the full output voltage of all of the panels in the series is applied to the damaged or shadowed cells in the panel concerned. This causes the damaged or shadowed cells to breakdown.

As a typical solar cell system has thousands of solar cells, its voltage output is normally in the range of hundreds of volts, and its current output is in the range of tens of amperes. At these output power levels, if the solar cell terminals are not protected, uncontrollable electric discharge in the form of sparks tends to occur, and this can cause damage to the solar cells and to the entire system.

U.S. Pat. No. 6,020,555 describes a solar cell system constituted by panels, each of which includes multiple solar cells, each solar cell being provided with a diode connected between its positive and negative terminals. The provision of the diodes, typically Schottky bypass diodes, does go some way to protecting the solar cells against the uncontrollable electric discharges mentioned above. Unfortunately, however, the air gap left between the terminals of each of the diodes does not eliminate risks of sparking and shorting, which can still occur if moisture or foreign particles bridge the air gap of such a diode. Thus, although air is a dielectric medium, it has a low dielectric strength, which means that, when an electric field across an air gap reaches around 3 mv/m, electric current can jump across the air gap and discharge in the form of sparks. This is referred to as dielectric medium breakdown.

Another shortcoming of the solar cell system described in U.S. Pat. No. 6,020,555 is the inability to manage heat dissipation of the bypass diodes. At a given moment when a solar cell is being "bypassed," the associated diode (assuming a standard system operating at 600-1000 V, 10 A) will be conducting 6000-10,000 watts of electrical power, some of which is radiated as thermal energy. Given the small size of these diodes, their operational life will be substantially shortened if heat is not well managed. Such a shortcoming is even more of a concern when the solar cell system is, for example, used in connection with a satellite and is, therefore, not field-repairable. Moreover, passive cooling using heat sinks or the like increases weight and is costly both in materials and in fabrication/assembly. Active cooling, while effective at managing the heat generated by the diodes, is very costly and heavy, and expends a substantial amount of the energy that the solar cell system generates.

Another disadvantage of known solar cell receivers is that, owing to the need for such a receiver to generate 10 watts of power at 1000 volts for an extended period of up to, or exceeding, twenty years, there is a danger of sparking at the electrical terminals which connect one receiver of a solar cell system to adjacent receivers.

SUMMARY

In an aspect of the invention, a solar cell receiver comprises a solar cell having one or more III-V compound semiconductor layers, a diode coupled in parallel with the solar cell and operable to be forward-biased in instances when the solar cell is not generating above a threshold voltage, a coating substantially encapsulating the diode, an undercoating that substantially eliminates any air gap between the anode and cathode of the diode, and a connector adapted to couple to other solar cell receivers.

The details of one or more implementations are set forth in the accompanying drawings and the description below. Other features and advantages will be apparent from the description and drawings, and from the claims.

BRIEF DESCRIPTION OF DRAWINGS

FIG. 1 is a perspective of a solar panel including apparatus for generating electricity from solar energy.

FIG. 2 is a perspective view of one solar cell module of the panel of FIG. 1.

FIG. 3 is a circuit diagram of the solar cell receiver of FIG. 4.

FIG. 4 is a perspective view of a solar cell receiver, which forms part of the solar cell module of FIG. 2.

FIG. 5 is a cross-section taken on line A-A of FIG. 4.

FIG. 6 is a view of the bottom of a solar cell receiver.

FIGS. 7A, 7B and 7C depict an alternate implementation of a solar cell.

DETAILED DESCRIPTION

The following is a description of preferred implementations, as well as some alternative implementations, of a solar cell receiver having an insulated bypass diode.

Overview

Solar cell receivers convert solar energy into electricity. To accomplish this result, solar cell receivers generally comprise one or more solar cells. A solar cell may be made from, e.g., silicon (including amorphous, nanocrystalline, or protocrystalline), cadmium telluride, CIGS (copper indium gallium diselenide), CIS (chalcopyrite films of copper indium selenide ($CuInSe_2$)), gallium arsenide (e.g., GaAs multijunctions), light absorbing dyes (e.g., ruthenium metalorganic dye), or organic semiconductors (e.g., polyphenylene vinylene, copper phthalocyanine or carbon fullerenes). In various implementations described herein, a triple-junction III-V compound semiconductor solar cell is employed, but other types of solar cells could be used depending upon the application. Solar cell receivers often contain additional components, e.g., connectors for coupling to an output device or other solar cell receivers.

For some applications, a solar cell receiver may be implemented as part of a solar cell module. A solar cell module may include a solar cell receiver and a lens coupled to the solar cell. The lens is used to focus received light onto the solar cell. Since a single solar cell module may not produce sufficient electricity for a given application, two or more solar cell modules may be grouped together into an array. These arrays are sometimes referred to as "panels" or "solar panels."

Implementations of a Solar Panel

FIG. 1 depicts an implementation of a solar panel 10, for generating electricity from solar energy. The panel 10 includes a plurality of solar cell modules 20. In this illustration, twenty-four solar cell modules 20 are shown. A plurality of similar panels 10 can be combined to provide a solar energy generating system of greater capacity. Where a plurality of panels 10 are provided, they are normally connected in series, but other implementations may connect the panels in parallel or series-parallel.

Implementations of a Solar Cell Module

As shown in FIG. 2, each solar cell module 20 includes a lens 22 (e.g., a Fresnel lens) and a solar cell receiver 12 positioned at opposite ends of a housing 21. The solar cell receiver includes a solar cell 30. In some implementations, the housing is in the shape of a trapezoidal solid, e.g., face 201 is larger than face 202.

In some implementations, the solar cell 30 is a triple-junction III-V solar cell, with each of the three sub-cells arranged in series. In applications where multiple solar cell modules 20 are employed, the receivers 12 of the solar cell modules 20 are typically electrically connected together in series. However, other applications may utilize parallel or series-parallel connection.

Implementations of a Solar Cell Receiver

FIG. 3 illustrates the circuit diagram of the receiver 12 of one of the solar cell modules 20. The receiver 12 includes a triple-junction III-V compound semiconductor solar cell 30 which is constituted by a top cell 30a, a middle cell 30b and a bottom cell 30c arranged in series.

When implemented in a solar cell module, the solar cell 30 is positioned to receive focused solar energy from the lens 22 (see FIG. 2). In some implementations, the lens 22 is configured such that sunlight incident upon the lens is concentrated by a factor of at least 100 onto the solar cell 30. The lens 22 may also comprise a multi-layer anti-reflective coating, similar to the one applied to the solar cell 30.

A diode 14 is connected in parallel with the triple-junction solar cell 30. In some implementations, the diode 14 is a semiconductor device such as a Schottky bypass diode or an epitaxially grown p-n junction. For purposes of illustration, diode 14 is a Schottky bypass diode. External connection terminals 43 and 44 are provided for connecting the solar cell 30 and diode 14 to other devices, e.g., adjacent receivers 12. In some implementations, the solar cell 30, the diode 14 and the terminals 43 and 44 are mounted on a board or substrate (see, e.g., item 9 of FIG. 4) which is made of insulating material.

The functionality of the diode 14 can be appreciated by considering multiple solar cell receivers 12 connected in series. Each of the triple junction solar cells 30 can be envisioned as a battery, with the cathode of each of the diodes 14 being connected to the positive terminal of the associated "battery" and the anode of each of the diodes being connected to the negative terminal of the associated "battery." When one of the serially-connected solar cells 30 becomes damaged or shadowed, its voltage output is reduced or eliminated (e.g., to below a threshold voltage associated with the diode 14). Therefore, the associated diode 14 becomes forward-biased, and a bypass current flows only through that diode 14 (and not the solar cell 30). In this manner, the non-damaged or non-shadowed solar cells continue to generate electricity from the solar energy received by those solar cells. If not for the diode 14, substantially all of the electricity produced by the other solar cell receivers 12 will pass through the shadowed or damaged solar cell 30, destroying it, and creating an open circuit within, e.g., the panel or array.

FIGS. 4, 5 and 6 illustrate one of the receivers 12. For purposes of this implementation, it is assumed that all of the other receivers in a given panel (e.g., item 10 of FIG. 1) are substantially the same.

FIG. 4 illustrates one solar cell 30 and its associated diode 14. The solar cell 30 is electrically connected to the diode 14. The upper surface of the solar cell 30 comprises a contact area 301 that, in this implementation, occupies the perimeter of the solar cell 30. In some implementations, the contact area 301 is smaller or larger to accommodate the desired connection type. For example, the contact area 301 may touch only one, two or three sides (or portions thereof) of the solar cell 30. In some implementations, the contact area 301 is made as small as possible to maximize the area that converts solar energy into electricity, while still allowing electrical connection. While the particular dimensions of the solar cell 30 will vary depending on the application, standard dimensions are about 12.58 mm×12.58 mm overall. 0.160 mm thick, and a total active area of about 108 mm$^2$. For example, in a solar cell 30 that is approximately 12.58 mm×12.58 mm, the contact area 301 is about 0.98 mm wide. The contact area 301 may be formed of a variety of conductive materials, e.g., copper, silver, and/or gold-coated silver. In this implementation, it is the n-conductivity side of the solar cell 30 that receives light, and accordingly, the contact area 301 is disposed on the n-conductivity side of the solar cell 30.

An anti-reflective coating 305 may be disposed on the solar cell 30. The anti-reflective coating 305 may be a multi-layer antireflective coating providing low reflectance over a certain wavelength range, e.g., 0.3 to 1.8 μm. An example of an anti-reflective coating is a dual-layer $TiO_x/Al_2O_3$ dielectric stack.

The contact 301 is coupled to a conductor trace 302 that is disposed on the board 9. In this implementation, the contact 301 is coupled to the conductor trace 302 by a plurality (twelve in this example) of wire bonds 304. The number of wire bonds 304 utilized in a particular implementation can be related, among other things, to the amount of current generated by the solar cell 30. Generally, the greater the current, the greater number of wire bonds that are used.

The conductor trace 302 (and hence, the solar cell 30) couples to terminal 11 of the diode 14 by way of an electrical connection between conductor trace 302 and conductor trace 45.

The other terminal 13 of the diode 14 is coupled to trace 46. To complete the parallel connection between the solar cell 30 and the diode 14, terminal 13 is coupled to the underside of the solar cell 30. This is discussed in greater detail in connection with FIGS. 5 and 6.

By way of traces 45 and 46, the diode 14 is electrically coupled to the connector terminals 43 and 44, respectively. The connector terminals 43 and 44 are electrically coupled to sockets 343 and 344, respectively, mounted in the apertures 42 and 41 of connector 40. Sockets 343 and 344 are shown in dotted lines because they are hidden from view by the body of the connector 40. The sockets comprise an electrically conductive material (e.g., copper, silver, gold and/or a combination thereof) and provide for electrical coupling of a device to the circuit. In some implementations, the sockets correspond to anode and cathode terminals, and are designed to accept receptacle plugs 341 and 342 for connection to the adjacent receivers 312, e.g., as described above with reference to FIG. 3. Adjacent receivers 312 may take substantially the same form as receiver 12. The connector 40, is in some implementations, securely attached to the board 9 and may be constructed out of an insulating material (e.g., plastic).

The relatively large connector 40, which defines insulated apertures 41 and 42, helps prevent a solar cell breakdown as a result of electric discharges at the terminals leading to adjacent receivers, owing to the insulated apertures providing an excellent insulation for each of the plug/socket electrical connections housed therein.

As shown in FIG. 5, the diode 14 is mounted above the board 9 on the terminals 11 and 13. Depending on the application, diode 14 may be a surface-mount type.

Terminals 11 and 13 couple to anode and cathode of the diode 14, respectively, and thus may be referred to as the anode terminal or cathode terminal of the diode 14. The portions of the diode 14 aside from the terminals 11 and 13 may be referred to as the diode body (i.e., hatched region 504).

In this implementation, diode terminal 13 is coupled electrically to a connector 501 that passes through the board 9 to couple the diode to the bottom surface of the solar cell 30. In some implementations, connector 501 may take the form of a pin that is attached to the diode 14, and is mounted using through-hole technology. The connector 501 may vary depending upon how the solar cell 30 is mounted on the board 9. If, for example, the board 9 is constructed so that bottom of the solar cell (e.g., the p-conductivity side) is exposed, the connector 501 may pass through the entire thickness of the board 9. In some implementations, the bottom of solar cell 30 may sit on top of a surface of the board 9. For such implementations, the connector 501 may couple to a layer of the board 9 (e.g., a layer below the top surface 505 of the board 9).

The gap between bottom portion 503 of the diode 14 (e.g., the surface(s) that face the board 9) and the board 9 is occupied by any suitable dielectric underfill material 15, so that there is no air gap between the diode and the board. In some implementations, there is no air gap between the contacts 11 and 13 and the underfill 15 occupies substantially all of the space between the bottom portion 503 of the diode 14 and the board 9. In that case, the underfill 15 is in contact with the bottom portion 503 of the diode 14 and the board 9. The underfill 15 may also contact other areas of the diode 14. Examples of suitable underfill materials include silicone. Similarly, a suitable dielectric globtop (or conformal coating) material 16 is deposited over the diode 14 so that the diode is encapsulated. The coating 16 is disposed over the top surface 502 of the diode 14 (e.g., the surface(s) that face away from the board 9) and extends downwardly until it reaches the board 9. The coating 16 thus encapsulates the diode body 504 as well as contacts 11 and 13. The coating 16 contacts the top surface 502 of the diode 14 as well as contacts 11 and 13. The coating 16 may contact other areas of the diode 14. Suitable globtop or conformal coating materials include those sold under the Loctite® brand by the Henkel Corporation. As the dielectric material 15 and 16 has a much higher dielectric strength than air, the risk of dielectric medium breakdown is substantially eliminated. The underfill and globtop dielectric materials 15 and 16 prevent uncontrolled discharge of electricity, and so protect the solar cells 30 of the system.

FIG. 6 depicts the bottom side of the receiver 12. The underside 601 of the solar cell 30 is a conductive (e.g., metallized) surface. The underside 601 may comprise copper, silver, and/or gold coated silver and is coupled to a conductive trace 602. The conductive trace 602 is coupled to connector 501, which is coupled to terminal 13 of the diode 14 (items 13 and 14 are shown in dotted lines because they are hidden in this view). The conductive trace 602 may be relatively wide to carry the current generated by the solar cell 30. In some embodiments, a jumper wire is used instead of, or in combination with, the conductive trace 602.

Depending upon the implementation, the underside 601 of the solar cell 30 may rest upon a surface of the board 9 (e.g., a layer above the bottom surface 506). In other implementations, there may be a cutout in the board 9 that exposes the underside 601 of the solar cell 30. The location of the conductive trace 602 can vary depending on how the solar cell 30 is mounted. For example, if there is a cutout in the board 9, the conductive trace 602 may be on the bottom surface 506 of the board 9. If the solar cell 30 rests upon a layer of the board above the bottom surface 506, the conductive trace 602 may not be on the bottom surface of the board (e.g., it may be disposed on a layer between the top 506 and bottom 506 surfaces of the board 9). In such implementations, the underside 601 of the solar cell and conductive trace 602 could be hidden in this perspective.

Second Implementation of a Solar Cell

FIGS. 7A, 7B and 7C depict a second implementation of a solar cell 730 for use, for example, in a solar cell receiver such as item 12 of FIGS. 2 and 4. Solar cell 730 is a multi-junction cell having n-on-p polarity and is composed of InGaP/(In)GaAs III-V compounds on a Ge substrate. The solar cell 730 also includes an anti-reflective coating comprising a dual-layer $TiO_x/Al_2O_3$ dielectric stack, whose spectral reflectivity characteristics are designed to minimize reflection at the coverglass-interconnect-cell (CIC) or solar cell assembly (SCA) level, as well as, maximizing the end-of-life (EOL) performance of the cells. FIGS. 7A and 7B are from the perspective of the n-polarity side.

One difference between this solar cell 730 and the solar cell 30 of FIG. 4 is that cell 730 utilizes two terminals 703 and 704 ("bus bars") rather than the perimeter contact 301 of cell 30. The terminals 703 and 704 are surrounded by a passivated frame 705 (visible in FIG. 7B, a close-up of region 701). The region occupied by the contacts 703 and 704 is not part of the active area 702 (e.g., a region capable of converting solar energy to electricity). One advantage of this implementation is that a large percentage of the overall surface area is the active area 702 because the contacts 703 and 704 occupy just two sides of the cell 730.

The overall dimensions of the cell 730 are about 11.18 mm (dimension 710) by 10.075 mm (dimension 714). The cell 730 is about 0.185 mm thick (dimension 718). The active area 702 is about 10 mm (dimension 712) by 10.075 mm (dimension 714).

The terminals 703 and 704 are about 9.905 mm wide (dimension 715) by 0.505 mm high (dimension 717), and are located about 0.085 mm (dimensions 713 and 719) from the edges of the cell 730. Accordingly, the distance from the outer edge of terminal 703 to the outer edge of terminal 704 is about 11.01 mm (dimension 711). The passivated frame 705 around the terminals 703 and 704 is about 0.01 mm thick (dimension 720). To account for variations in processing (e.g., saw curf), some implementations employ a thin border (e.g., 0.035 mm, dimension 716) around the entire cell 730 where there are no features.

The bottom of cell 730 (i.e., the p-polarity side) is substantially similar to that of cell 30 illustrated in FIG. 6.

Other Results

In addition to solving the problem of uncontrolled discharge, the use of the underfill and/or globtop (e.g., conformal coating) can result in additional, unexpected, advantages.

Using underfill and/or globtop can substantially improve the ability of a receiver to manage heat dissipation. The underfill and globtop dielectric materials 15 and 16 have a higher thermal conductivity than air. Consequently, they improve heat dissipation from the components of the system to the surrounding ambient atmosphere by increasing the cross-section of the thermal path. Moreover, because the underfill and globtop dielectric materials 15 and 16 are, in some implementations, in contact with the board or substrate, they facilitate heat transfer from the diode to the board. For example, the underfill 15 and globtop 16 substantially improve the heat dissipation of the diode 14. As described above, when bypassing the solar cell 30, the diode 14 may be carrying several thousand (e.g., 10,000) watts of electrical power. Because diodes are not perfectly efficient electrical conductors, some of that power is dissipated as thermal energy. Excessive thermal energy can destroy the diode, and at a minimum, reduce its service life. As a result, receivers that employ underfill and/or globtop are likely to have increased service life, especially as power levels increase. Moreover, the underfill and/or globtop is a much more cost effective, efficient and lighter solution than many other methods (e.g., passive cooling using metal heat sinks or active cooling) for improving heat management. Moreover, those other methods do not solve the problem of uncontrolled discharge.

The underfill and/or globtop materials can also protect against short circuits due to contaminants. In some implementations, the conductor traces (e.g., items 45 and 46) are separated by no more than approximately 1 mm (0.394 inches). When traces are about this close to each other, many contaminants, such as a droplet of water, are sufficiently large to contact two adjacent conductor traces. Moreover, as the diode 14 is itself relatively small, it is possible for one or more water droplets to bridge terminals 11 and 13. Since solar receivers 12 often are used outdoors, they are exposed to moisture, for example, from condensation and/or rain. The use of the underfill and/or globtop prevents moisture from condensing on the terminals of the diode 14 or on the conductor traces 45 and 46, thereby reducing the probability of short circuits.

The underfill and/or dielectric globtop (or conformal coating) materials 15 and 16 also prevent foreign materials falling onto the terminals of the diodes 14, onto the conductor traces 45 and 46 and onto any electrical traces on the board 9, thereby further reducing the probability of short circuits during operation.

Another unexpected advantage is that the underfill and/or globtop dielectric materials 15 and 16 add mechanical integrity to the interfaces between the diodes 14 and the boards 9 to which they are attached. As a result, during transport, installation and handling, the likelihood of the diode 14 becoming detached (or otherwise electrically de-coupled) is reduced.

Typical Performance Data

Testing implementations of solar cell receivers (e.g., item 12) at different solar concentrations resulted in the following data:

|  | 1 Sun | 470 Suns | 1150 Suns |
|---|---|---|---|
| Efficiency | 31.23% | 36.23% | 33.07% |
| $V_{oc}$ (open circuit voltage) | 2.583 V | 3.051 V | 3.078 V |
| $J_{sc}$ (short circuit current) | 13.9 mA/cm$^2$ | 6.49 A/cm$^2$ | 15.92 A/cm$^2$ |
| $V_{mp}$ (voltage at maximum power point) | 2.32 V | 2.704 V | 2.523 V |
| $J_{mp}$ (current at maximum power point) | 13.46 mA/cm$^2$ | 6.27 A/cm$^2$ | 15.04 A/cm$^2$ |
| $P_{mp}$ (maximum power point) | 31.23 mW/cm$^2$ | 17.03 W/cm$^2$ | 38.03 W/cm$^2$ |

Principles of the present invention can be applied to terminals, leads, traces and conductors of semiconductor components on substrates, carriers, packages, daughter boards, mother boards, and panels used in solar power systems. The present invention can be applied to all types of semi-conductors including, but not limited to, bare dye, through hole, BGA, PGA, LGA and flip chip devices.

It will be apparent that modifications could be made to the apparatus described above. In particular, the dielectric material could be applied not only to the diodes, but also to all terminals, leads, and conductor traces on the panel. Moreover, the present invention can be used to apply a dielectric coating to any form of conductors and substrates used in solar power systems.

A number of implementations have been described. Nevertheless, it will be understood that various modifications may be made without departing from the spirit and scope of the invention. Accordingly, other implementations are within the scope of the claims.

What is claimed is:

1. An apparatus for converting solar energy to electricity comprising:
    a substrate;
    a semiconductor solar cell device mounted on the substrate and having a top surface and a bottom surface, said semiconductor solar cell device comprising one or more III-V compound semiconductor layers, a first contact coupled to a p-polarity side of the semiconductor solar cell device and a second contact coupled to an n-polarity side of the semiconductor solar cell device;
    a diode mounted on the substrate and being laterally offset from the top surface and bottom surface of the semiconductor solar cell device, said diode comprising a body, an anode contact and a cathode contact, the diode coupled in parallel with the first and second contacts of the semiconductor solar cell device such that a first conductive trace on the substrate couples the anode contact of the diode to the second contact of the semiconductor solar cell device, and a second conductive trace on the substrate couples the cathode contact of the diode to the first contact of the semiconductor solar cell device, wherein the diode body comprises a top portion and a bottom portion, the bottom portion being disposed closer to the substrate than the top portion;
    a coating disposed over the top portion of the diode body and extending to and contacting the substrate and substantially encapsulating the diode body, anode contact and cathode contact;
    an undercoating occupying substantially all of the space between the bottom portion of the diode body and the substrate; and
    output terminals coupled to the semiconductor solar cell device and the diode.

2. The apparatus of claim 1 wherein the undercoating is disposed such that there is no air gap between the diode and the substrate.

3. The apparatus of claim 1 wherein the undercoating and coating have a higher dielectric strength than air.

4. The apparatus of claim 1 wherein the undercoating and coating have a higher thermal conductivity than air.

5. The apparatus of claim 1 further comprising a connector electrically coupled to the output terminals, the connector being operable to provide electrical connection to one or more solar apparatuses, the connector comprising:
    two apertures electrically insulated from each other, one aperture comprising a first electrical socket and the other aperture comprising a second electrical socket, wherein the anode contact of the diode and the first contact are electrically coupled to the first electrical socket and the cathode contact of the diode and the second contact are electrically coupled to the second electrical socket.

6. The apparatus of claim 5 wherein the connector is laterally offset from the semiconductor solar cell device and the diode.

7. The apparatus of claim 5 wherein the connector is adapted to electrically connect one solar apparatus to one or more additional solar apparatuses.

8. The apparatus of claim 1 wherein the second contact comprises electrically conductive material disposed on the perimeter of the n-polarity side of the semiconductor solar cell device.

9. The apparatus of claim 1 wherein the second contact comprises electrically conductive material disposed adjacent to two edges of the n-polarity side of the semiconductor solar cell device.

10. The apparatus of claim 1 wherein the first contact comprises a metal layer disposed on substantially the entire p-polarity side of the semiconductor solar cell device.

11. The apparatus of claim 1 wherein the semiconductor solar cell device comprises a multijunction cell comprising at least one layer comprising InGaP, InGaAs or GaAs.

12. An apparatus for converting solar energy to electricity comprising:
    a substrate;
    a semiconductor solar cell device mounted on the substrate, said semiconductor solar cell device configured to convert solar energy into electricity;
    a diode mounted on the substrate and spaced away from the semiconductor solar cell device with the diode being spaced away from a plane that extends through the semiconductor solar cell device and is perpendicular to the substrate, said diode comprising terminals and coupled in parallel with the semiconductor solar cell device, said diode configured to substantially prevent current flow through the semiconductor solar cell device in instances when an output voltage of the semiconductor solar cell device is below a threshold voltage, said the diode comprising a first area facing the substrate and a second area facing away from the substrate;
    a coating that encapsulates the diode, the coating in contact with the substrate and the second area of the diode;
    an undercoating to prevent shorting of the diode terminals, the undercoating disposed between the diode terminals and in contact with the first area of the diode and the substrate;
    first and second traces with said first trace coupling one terminal of the diode to a first contact coupled to one side of the semiconductor solar cell device, and said second trace coupling another terminal of the diode to a second contact coupled to another side of the semiconductor solar cell device; and
    an output structure coupled to the diode and the semiconductor solar cell device, said output structure configured to couple to at least one other solar cell apparatus.

13. The apparatus of claim 12 wherein the semiconductor solar cell device comprises a multifunction cell with a plurality of layers.

14. The apparatus of claim 13, wherein at least one of the plurality of layers comprises InGaP, InGaAs or GaAs.

15. The apparatus of claim 12 wherein the semiconductor solar cell device comprises an anti-reflective coating.

16. The apparatus of claim 12 wherein the undercoating and coating have a higher dielectric strength than air.

17. An apparatus for converting solar energy to electricity comprising:
- a substrate with top and bottom sides;
- a semiconductor solar cell device exposed on the top side of the substrate and comprising one or more III-V compound semiconductor layers, a first contact coupled to a p-polarity side of the cell, and a second contact coupled to an n-polarity side of the semiconductor solar cell device;
- a diode mounted on the top side of the substrate and spaced laterally away from the semiconductor solar cell device, said diode comprising an anode terminal and cathode terminal, said diode coupled in parallel with the semiconductor solar cell device and configured to be reverse-biased when the semiconductor solar cell device generates an output voltage at or above a threshold voltage, and configured to be forward-biased when the semiconductor solar cell device generates an output voltage below the threshold voltage;
- a coating encapsulating the diode, the coating in contact with the substrate;
- an undercoating disposed between a bottom of the diode and the top side of the substrate, and between the anode terminal and cathode terminal;
- a first conductive trace coupling the anode terminal of the diode to the second contact of the semiconductor solar cell device;
- a second conductive trace coupling the cathode terminal of the diode to the first contact of the semiconductor solar cell device; and
- a connector connected in parallel with the semiconductor solar cell device and the diode.

18. The apparatus of claim 17 wherein the semiconductor solar cell device comprises a multijunction cell comprising at least one layer comprising InGaP, InGaAs or GaAs.

19. The apparatus of claim 17 wherein the connector is configured to provide an electrical connection between one solar apparatus and one or more additional solar apparatuses.

20. The apparatus of claim 17 wherein the connector is mounted on the top side of the substrate and is laterally spaced from the semiconductor solar cell device and the diode.

* * * * *

UNITED STATES PATENT AND TRADEMARK OFFICE
CERTIFICATE OF CORRECTION

| | | |
|---|---|---|
| PATENT NO. | : 8,088,992 B2 | Page 1 of 1 |
| APPLICATION NO. | : 12/703561 | |
| DATED | : January 3, 2012 | |
| INVENTOR(S) | : Lu Fang | |

It is certified that error appears in the above-identified patent and that said Letters Patent is hereby corrected as shown below:

Title page, col. 1, Section (73) Assignee, "Encore" should be --Emcore--;

Col. 10, claim 13, line 60, "multifunction" should be --multijunction--.

Signed and Sealed this
Twenty-eighth Day of August, 2012

David J. Kappos
*Director of the United States Patent and Trademark Office*